(12) United States Patent
Doan et al.

(10) Patent No.: US 7,944,025 B2
(45) Date of Patent: May 17, 2011

(54) SEMICONDUCTOR CONSTRUCTIONS

(75) Inventors: Trung Tri Doan, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1322 days.

(21) Appl. No.: 11/452,830

(22) Filed: Jun. 13, 2006

(65) Prior Publication Data
US 2006/0234167 A1 Oct. 19, 2006

Related U.S. Application Data

(63) Continuation of application No. 10/683,207, filed on Oct. 9, 2003, now abandoned.

(51) Int. Cl.
*H01L 29/02* (2006.01)
(52) U.S. Cl. .............. 257/618; 257/E21.219; 430/270.1
(58) Field of Classification Search .................. 257/300, 257/618, E21.219; 430/270.1, 320
See application file for complete search history.

(56) References Cited

U.S. PATENT DOCUMENTS

| | | | |
|---|---|---|---|
| 5,474,877 A | 12/1995 | Suzuki | |
| 5,678,116 A | 10/1997 | Sugimoto et al. | |
| 6,328,905 B1 | 12/2001 | Lebowitz et al. | |
| 6,358,673 B1 | 3/2002 | Namatsu | |
| 6,451,510 B1 | 9/2002 | Messick et al. | |
| 6,599,683 B1 * | 7/2003 | Torek et al. | 430/326 |
| 6,660,459 B2 * | 12/2003 | Babcock | 430/325 |
| 2002/0132184 A1 * | 9/2002 | Babcock | 430/270.1 |
| 2003/0165756 A1 | 9/2003 | Ono et al. | |
| 2004/0072108 A1 * | 4/2004 | Hyon | 430/331 |
| 2004/0166779 A1 * | 8/2004 | Balijepalli et al. | 451/41 |
| 2006/0278254 A1 * | 12/2006 | Jackson | 134/21 |
| 2007/0166771 A1 * | 7/2007 | Kapur et al. | 435/7.2 |
| 2008/0004194 A1 * | 1/2008 | McDermott et al. | 510/175 |

FOREIGN PATENT DOCUMENTS

| JP | 4-33338 | 2/1992 |
|---|---|---|
| JP | 404033338 A | 2/1992 |

OTHER PUBLICATIONS

Memorandum To: Dr. Roger Bonneccaze From: Cyrus R. Tabery Date: May 4, 2000 Subject: A report on shear and bending of a resist beam under the influence of surface tension forces; found at http://willson.cm.utexas.edu/ResearchSub.

NanoTech Wisconsin; *Resist Collapse: Determination of Elastic Constants*, by Kevin Van Workum et al.; May 3, 1999; found at http://www.xraylith.wise.edu/~vanw/seminar/kevin.pdf.

* cited by examiner

*Primary Examiner* — Nathan W Ha
(74) *Attorney, Agent, or Firm* — Wells St. John P.S.

(57) ABSTRACT

The invention includes a process whereby a solvent is utilized to remove soluble portions of a resist, and subsequently the solvent can be removed with a gas-fortified liquid. In particular aspects, the gas-fortified liquid emits bubbles during the removal of the solvent. Additionally, the gas-fortified liquid can be utilized to remove residual resist scum, and in such aspects the gas-fortified liquid can emit bubbles during the scum removal.

11 Claims, 4 Drawing Sheets

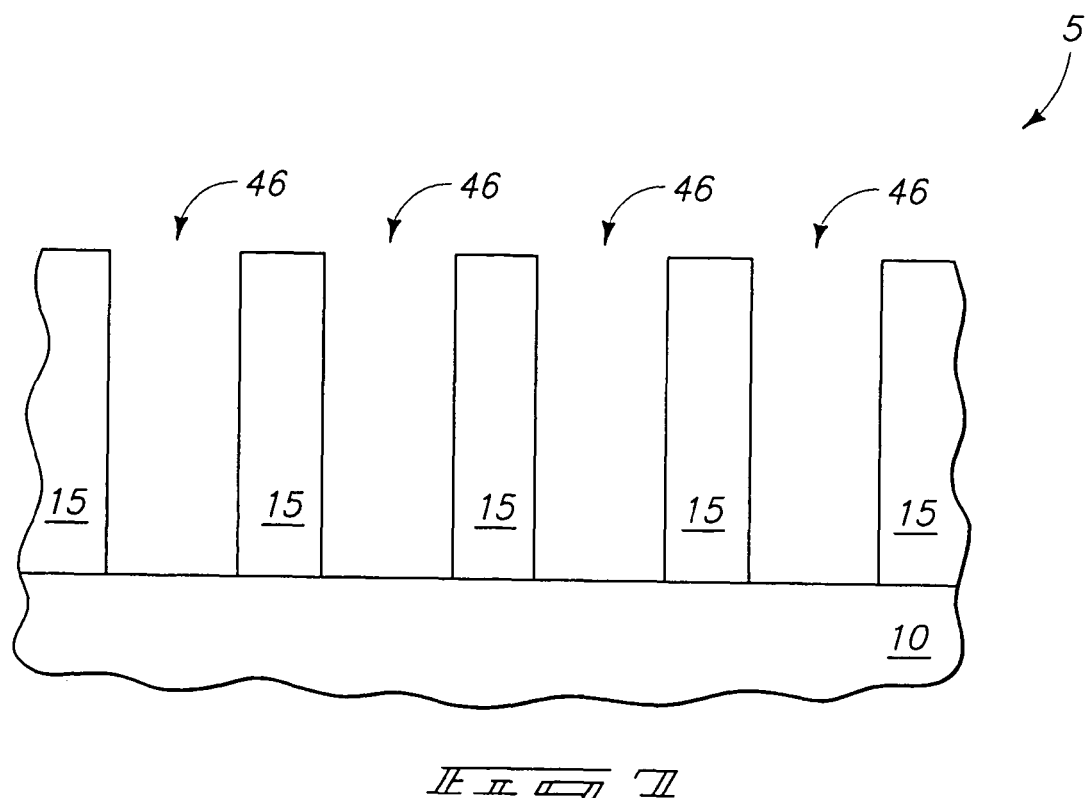
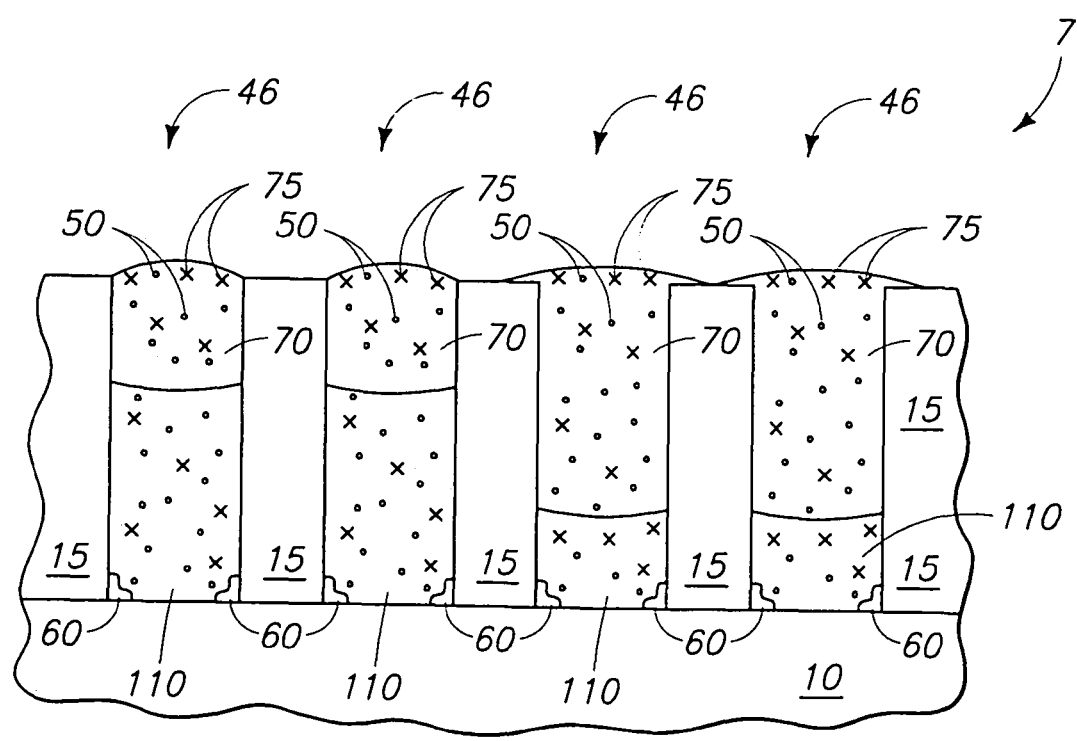

SEMICONDUCTOR CONSTRUCTIONS

RELATED PATENT DATA

This patent resulted from a continuation of U.S. patent application Ser. No. 10/683,207, filed Oct. 9, 2003, now abandoned which is hereby incorporated by reference.

TECHNICAL FIELD

The invention relates to processes for preparing semiconductor substrates, and more particularly, methods for preparing and removing resist from semiconductor substrates.

BACKGROUND OF THE INVENTION

The manufacture of integrated circuits is heavily reliant on a process known as "photolithography." Through photolithography, a precise mask of photosensitive material (photoresist) can be patterned over a substrate. The mask can be subsequently used for the fabrication of highly complex circuits.

Photolithography typically involves the following steps. Initially, a layer of resist is formed over a substrate. A reticle is subsequently placed above the resist and radiation is allowed to pass through the reticle exposing the resist to radiation in patterns defined by the reticle. Depending on whether the resist is a negative resist or a positive resist, the radiation renders exposed portions of the resist more or less soluble in a solvent relative to unexposed portions. The solvent is subsequently utilized to remove the more soluble portions of the resist while leaving the less soluble portions as a patterned mask. A pattern can be transferred from the mask to the underlying substrate with a suitable etch.

A continuing goal of semiconductor processing is increased miniaturization while maintaining high performance. It is known in the art that to achieve high resolution a thin layer of resist is preferred. However, a thin layer of resist typically does not withstand significant etching of the substrate material. Therefore, thicker layers of resist, or resists having high aspect ratios, are utilized, but such use creates problems.

U.S. Pat. No. 6,451,510 to Messick, et al. describes a problem of collapse when using a photoresist having a high aspect ratio, and the desirability of overcoming this adverse phenomenon. Referring to FIG. 1, a semiconductor fragment 1 is shown demonstrating the problem of collapse. A patterned resist 15 is layered over substrate 10. The patterned resist comprises vertically elongate discrete pillars, and the pillars are spaced from one another by gaps 17. A rinse 20 having a high surface tension exists in the gaps 17 between the resist pillars. Collapse occurs as the surface tension of rinse 20 draws the resist pillars toward one another or apart from one another, whichever the case may be. The tops of the pillars can contact one another, and stick together, to effectively block a gap between them.

Another problem encountered when removing resist from over a substrate is sometimes referred to as "scumming." Scumming typically occurs when soluble resist is not completely removed from the substrate. Residual undissolved resist remaining after development can inhibit subsequent etching of an underlying substrate. This can lead to poor resolution and less than precise substrate processing.

SUMMARY OF THE INVENTION

In one aspect, the invention includes a process for treating a substrate having resist thereon. A gas-fortified liquid is applied to the resist. The pH of the liquid applied to the resist can be adjusted with the gas, and/or the surface tension of the liquid applied to the resist can be adjusted with the gas.

In one aspect, the invention includes a process for treating a substrate. A resist layer is formed over the substrate. A first portion of the resist layer is exposed to radiation while a second portion of the resist layer is not exposed. One of the first or second portions is selectively removed relative to the other with a solvent. The solvent is removed with a gas-fortified liquid.

In one aspect, the invention includes a process for removing residual resist from a substrate. A gas-fortified liquid is applied to the resist. The gas-fortified liquid emits bubbles. Subsequently, the liquid is removed while it continues to emit bubbles.

BRIEF DESCRIPTION OF THE DRAWINGS

Preferred embodiments of the invention are described below with reference to the following accompanying drawings.

FIG. 7 is a view of the FIG. 2 wafer fragment shown at a processing step subsequent to that of FIG. 6.

FIG. 8 is a diagrammatic cross-sectional view of a semiconductor wafer fragment at a processing step in accordance with another aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention provides new processes for treating a semiconductor substrate with a gas-fortified liquid. In one aspect, the gas-fortified liquid has a surface tension and/or pH that has been altered by introducing the gas. The gas can be introduced to the liquid prior to treating the substrate with the gas-fortified liquid and/or the gas can be introduced to the liquid at the substrate. Carbon dioxide is a gas that, when introduced according to the invention, alters the surface tension and/or the pH of the liquid. An exemplary process is described with reference to FIGS. 2-7.

Figure 2:
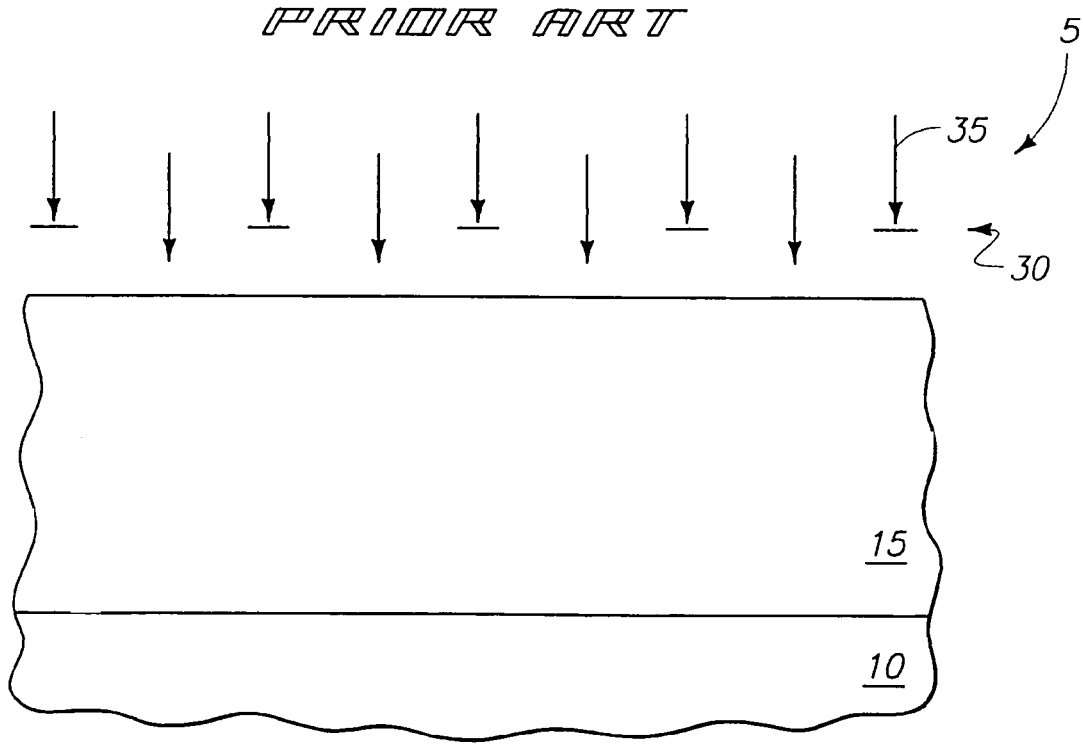
FIG. 2 is a diagrammatic cross-sectional view of a semiconductor wafer fragment at an initial processing step in accordance with an aspect of the invention.

Referring to FIG. 2, a semiconductor fragment 5 is shown. Fragment 5 comprises a substrate 10 having resist 15 thereon. In the context of this document, the term "substrate," "semiconductor substrate" or "semiconductive substrate" is defined to mean any construction comprising semiconductive materials, including but not limited to, bulk semiconductive materials such as semiconductive wafer (either alone or in assemblies comprising other materials thereon), and semiconductive material layers (either alone or in assemblies comprising other materials). The term "substrate" refers to any supporting structure, including but not limited to the semiconductive substrates described above. Further, in the context of this document, the term "layer" encompasses both the singular and the plural.

It is preferred that resist 15 is a uniform layer. Exemplary methods of providing this uniform layer include photoresist spinning, static spin processes, dynamic dispense processes, moving-arm dispense processes, and manual and automatic spinning. In the context of this document, the term "resist" defines material which is capable of having its solubility changed by exposure to a suitable energy such as, by way of example only, radiation, including light and ultraviolet radiation. Resist may be referred to as "photoresist." Resist also includes both positive and negative resist. It is understood that negative resists are those resists that are soluble prior to the application of radiation. Alternatively, positive resists are those resists that are insoluble prior to the application of radiation. Either resist may be utilized in various aspects of the invention.

FIG. 2 shows a reticle 30 over resist 15 and exposure of resist 15 to radiation 35 passing through reticle 30. Reticle 30 may also be referred to as a "photomask." In practice reticle 30 is aligned over resist 15 to provide a desired image upon resist 15. Passing radiation 35 through reticle 30 results in desired portions of resist 15 being exposed to radiation while other portions of resist 15 remain unexposed. Upon exposure, one of the exposed or unexposed portions of resist 15 is rendered more soluble in a liquid solvent than the other. In the description that follows, the exposed portion is indicated to be rendered more soluble that the unexposed portion.

Figure 3:
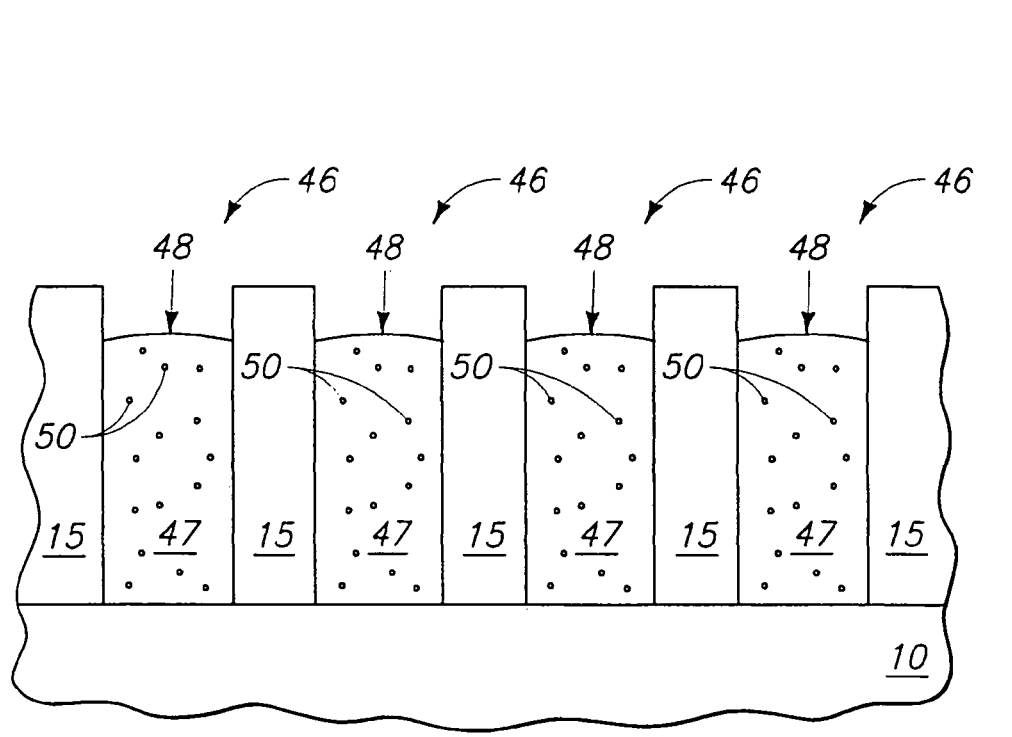
FIG. 3 is a view of the FIG. 2 wafer fragment shown at a processing step subsequent to that of FIG. 2.

Referring to FIG. 3, a wafer fragment 5 is shown after exposure to the radiation, with the gas-fortified liquid (labeled 47 in FIG. 3) utilized to selectively remove the exposed portions relative to the unexposed portions of resist 15. The gas-fortified liquid is thus used to form gaps 46 within resist 15.

The utilization of a liquid to remove a portion of the resist subsequent to irradiation of the resist is typically referred to as development of the resist and the liquid used to develop the resist is typically referred to as developing liquid. For purposes of this disclosure, developing liquids can include the gas-fortified liquid of the present invention.

Exemplary liquids which can be used during negative resist development include xylene and stoddard solvents. Exemplary liquids which can be used during positive resist development include sodium hydroxide and tetramethyl ammonium hydroxide solutions. Exemplary methods used to apply developing liquids to resist include immersion, spray and puddle development. Persons having ordinary skill in the art of photolithography will recognize that the selection of the method used to apply liquids can be dependent on, for example, resist polarity, the feature size, defect density considerations, the thickness of the layer to eventually be etched and desired productivity.

According to the shown aspect of the invention, gas-fortified liquid 47 is utilized to remove a portion of the resist subsequent to irradiation of the resist. Additionally, or alternatively, gas-fortified liquid 47 can effervesce during the development process to produce bubbles 50 (only some of which are labeled). Gas-fortified liquid 47 can have a low surface tension. As shown in FIG. 3 meniscus 48 can be exemplary of a meniscus of a liquid having a low surface tension. As described above, the utilization of high surface tension liquids during the development process can lead to collapse of the resist. (see, e.g., FIG. 1).

Figure 4:
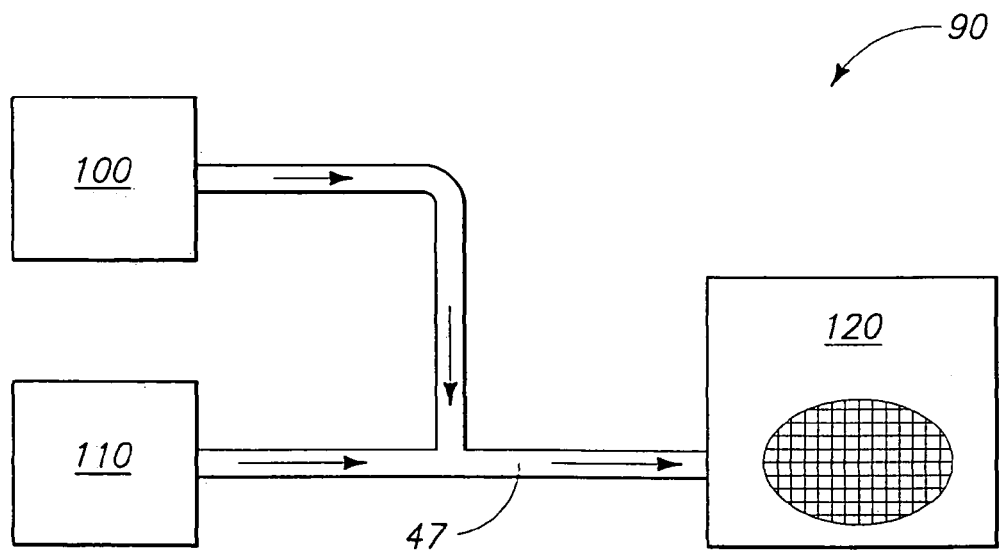
FIG. 4 is a schematic view of an apparatus that can be utilized for the preparation of gas-fortified liquid according to one aspect of the invention.

Referring to FIG. 4, an exemplary apparatus 90 is illustrated which can be utilized to produce gas-fortified liquid 47, and more particularly, to provide gas-fortified liquid 47 to a wafer treatment chamber 120. Initially a gas 100 is combined with a liquid 110 to produce the gas-fortified liquid 47. Due to the gas fortification, a gas content of liquid 47 is increased relative to that of liquid 110. The gas fortification can, in particular aspects, alter the pH of liquid 110 to produce a pH-adjusted liquid, and/or alter the surface tension of liquid 110 to produce a surface-tension-adjusted liquid. In an aspect of the invention, the pH-adjusted liquid has a pH less than that of the liquid prior to pH adjustment; and in an additional or alternative aspect of the invention, the surface-tension-adjusted liquid has a surface tension less than that of the liquid prior to surface tension adjustment. Accordingly, a gas-fortified liquid can be a pH-adjusted liquid and/or a surface-tension-adjusted liquid. Gas-fortified liquid 47 is flowed to wafer treatment chamber 120. Although FIG. 4 illustrates the application of gas-fortified liquid 47 to a wafer within a chamber 120, it is to be understood that the invention encompasses other aspects (not shown) in which the application is conducted without a chamber.

Exemplary gases which can be utilized to fortify the liquid are carbon dioxide, ammonia and isopropyl alcohol. Carbon dioxide can be preferred because of its low impact on the environment. In an aspect of the invention, gas 100 of gas-fortified liquid 47 comprises, consists essentially of, and/or consists of carbon dioxide.

Liquid 110 can be, for example, predominantly aqueous or predominantly organic. For purposes of this disclosure liquids include, at least, both developing liquids and rinsing liquids. The liquid utilized in accordance with the present invention can be free of particular contaminants and only contain volatile contaminants, if any.

Liquids used during resist development can further include liquids used to remove or rinse developing liquids from the resist. The utilization of a liquid to remove or rinse developing liquids from resist subsequent to the application of the developing liquid to the resist is typically referred to as rinsing of the resist and the liquid used to rinse the resist is typically referred to as rinsing liquid. An exemplary liquid useful for rinsing positive resist includes water, and an exemplary liquid useful for rinsing negative resist includes n-butylacetate. In an aspect of the invention liquid 110 of gas-fortified liquid 47 comprises, consists essentially of, and/or consists of water. Typically, developing liquid is removed by applying a rinse liquid in substantially the same manner as was used to apply the liquid. For purposes of this disclosure, rinsing liquids can include the gas-fortified liquid of the present invention.

Figure 1:
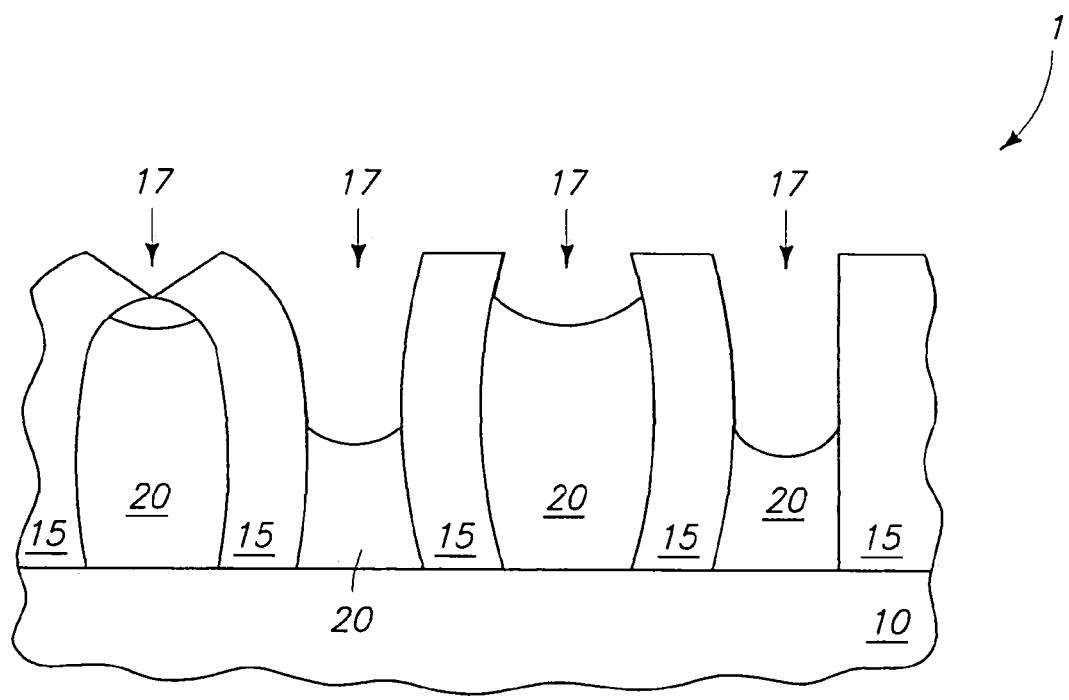
FIG. 1 is a diagrammatic cross-sectional view of a wafer fragment demonstrating the prior art collapse of resist.
Figure 5:
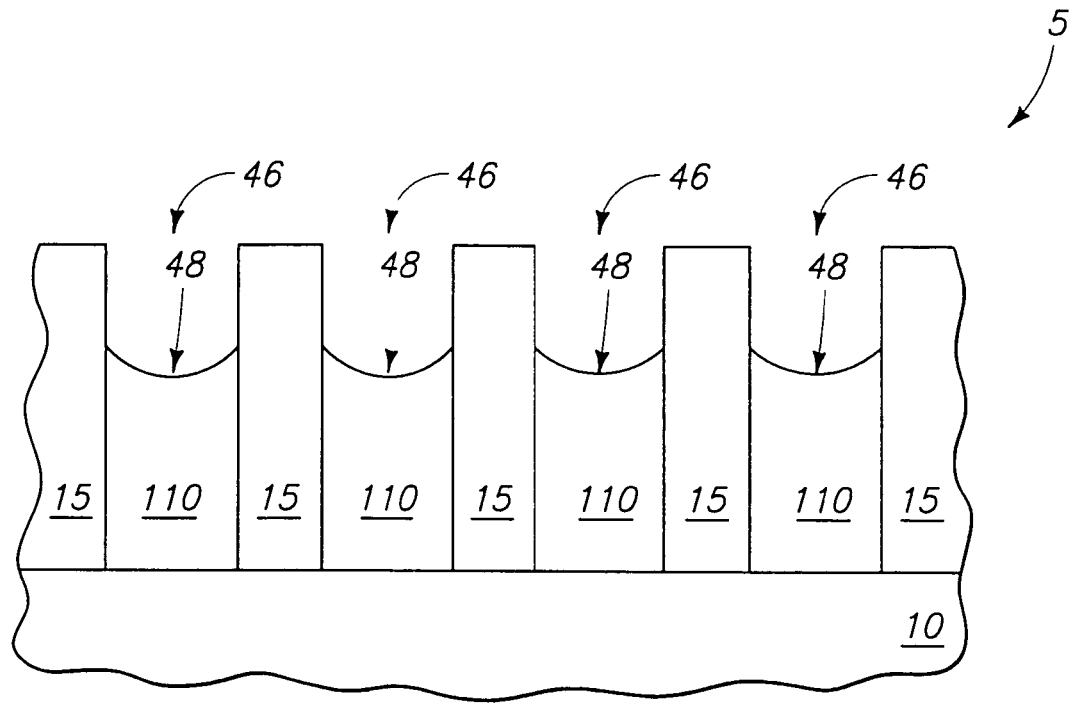
FIG. 5 is a view of the FIG. 2 wafer fragment shown at a processing step subsequent to that of FIG. 3.

Referring to FIG. 5, wafer fragment 5 is shown at a processing step after application of the developing liquid and prior to removal of the developing liquid with a rinsing liquid. The fragment comprises channels 46 between resist pillars 15, and developing liquid 110 is within the channels. Liquid 110 can be a remaining portion of a development solution and remains after an exposed portion has been dissolved within channel 46. The liquid 110 includes meniscuses 48 within channel 46. FIG. 5 demonstrates meniscuses 48 having a relatively high surface tension. As illustrated in FIG. 1, liquids having high surface tensions within resist channels may lead to collapse of the resist. According to an aspect of this invention, high surface tension development solutions can be rinsed with a gas-fortified liquid, pH-adjusted liquid and/or surface-tension-adjusted liquid prior to removal.

Figure 6:
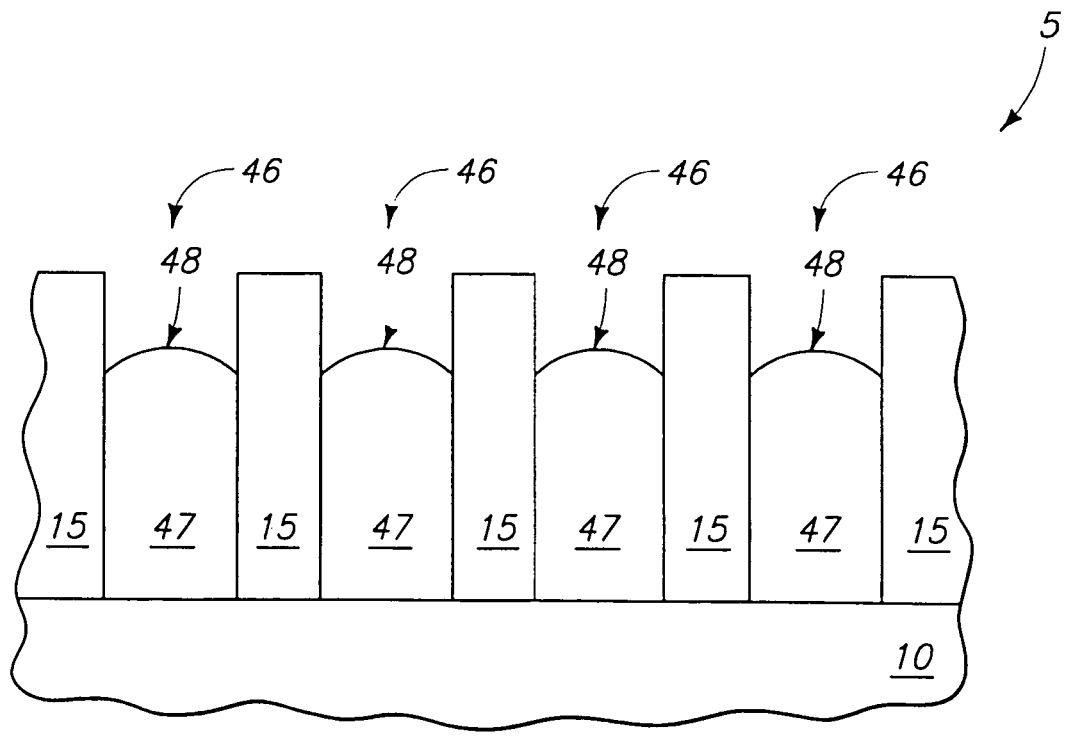
FIG. 6 is a view of the FIG. 2 wafer fragment shown at a processing step subsequent to that of FIG. 5.

Referring to FIG. 6, wafer fragment 5 is shown at a processing step after addition of gas-fortified liquid 47. The fragment comprises channels 46 between pillars 15, and gas-fortified liquid 47 within the channels. Gas-fortified liquid 47 is shown having low surface tension to the extent that the meniscus 48 extends upwardly. According to an aspect of the invention, gas-fortified liquid 47 can be used to rinse liquids, including developing and/or rinse liquids having high surface tensions, from resist. In accordance with an aspect of the invention, gas fortification can reduce the surface tension of a prior art liquid (e.g., liquid 20 of FIG. 1), and accordingly the prior art problem of resist collapse (FIG. 1) is not present in the construction of FIG. 6.

Following the application of gas-fortified liquid 47 to resist 15, gas-fortified liquid 47 can be removed. Exemplary methods of removal can include spinning followed by thermal processing (e.g. a "hard bake"). FIG. 7 illustrates semiconductor wafer fragment 5 after removal of gas-fortified liquid 47. As illustrated, gas-fortified liquid 47 has been removed without the detrimental collapse effect described in the prior art. Preferably, the removal of gas-fortified liquid 47 leaves the contaminant-free channel 46, as shown.

Referring to FIG. 8, wafer fragment 7 is shown at a processing step after developing liquid application. The fragment comprises channels 46 between resist pillars 15. Liquid 110 and a foam 70 are within channels 46. Bubbles 50 and particles 75 are within liquid 110 and foam 70. The fragment further comprises undissolved resist 60 ("scum") proximate substrate 10.

According to another embodiment of the invention, undissolved resist 60 ("scum") is removed by allowing liquid 110 to effervesce during the liquid removal process. Liquid 110 may be applied to substrate 10 or resist 15 according to the methods described above. According to this embodiment, the liquid removed from the resist may be either fortified as described herein, or unfortified. To allow for sufficient effervescence during liquid removal it can be preferred to utilize a gas-fortified liquid, such as that described above. Upon removal of Liquid 110, bubbles 50 (only some of which are labeled) evolve from the liquid 110 and facilitate the migration of resist particles 75 (only some of which are labeled) to the upper portions of resist 15 for subsequent removal. In one embodiment, liquid 110 effervesces to such an extent that foam 70 containing particles 75 may be generated at the upper portions of resist 15. An exemplary technique for causing liquid 110 to effervesce is to utilize a vacuum chamber during application and/or removal of liquid 110 to reduce the gas pressure surrounding liquid 110, and thereby facilitate the emission of bubbles 50.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction comprising:
   a semiconductive wafer;
   a photoresist supported by the wafer, the photoresist defining a plurality of channels extending therein; and
   an effervescing liquid mixture within at least some of the channels, the effervescing liquid mixture comprising water and one of carbon dioxide or ammonia.

2. The construction of claim 1 wherein the semiconductive wafer comprises monocrystalline silicon.

3. The construction of claim 1 wherein the effervescing liquid mixture comprises water and carbon dioxide.

4. The construction of claim 1 wherein the effervescing liquid mixture comprises water and ammonia.

5. The construction of claim 1 wherein the effervescing liquid mixture consists essentially of water and one of carbon dioxide or ammonia.

6. The construction of claim 1 wherein the effervescing liquid mixture consists of water and one of carbon dioxide or ammonia.

7. The construction of claim 1 wherein the effervescing liquid mixture consists of water and carbon dioxide.

8. The construction of claim 1 wherein the effervescing liquid mixture consists of water and ammonia.

9. The construction of claim 1 wherein the effervescing liquid mixture further comprises particles of photoresist scum.

10. The construction of claim 9 wherein at least a portion of the particles reside around the surface of the liquid mixture.

11. The construction of claim 1 wherein the effervescing liquid mixture comprises a parabolic surface having a vertex extending outwardly from the liquid.

\* \* \* \* \*